US010656994B2

(12) United States Patent
Berger et al.

(10) Patent No.: US 10,656,994 B2
(45) Date of Patent: *May 19, 2020

(54) OVER-VOLTAGE WRITE OPERATION OF TUNNEL MAGNET-RESISTANCE ("TMR") MEMORY DEVICE AND CORRECTING FAILURE BITS THEREFROM BY USING ON-THE-FLY BIT FAILURE DETECTION AND BIT REDUNDANCY REMAPPING TECHNIQUES

(71) Applicant: SPIN MEMORY, Inc., Fremont, CA (US)

(72) Inventors: Neal Berger, Cupertino, CA (US); Benjamin Louie, Fremont, CA (US); Mourad El-Baraji, Fremont, CA (US); Lester Crudele, Tomball, TX (US)

(73) Assignee: SPIN MEMORY, INC., Fremont, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 15/855,910

(22) Filed: Dec. 27, 2017

(65) Prior Publication Data

US 2019/0121694 A1   Apr. 25, 2019

Related U.S. Application Data

(63) Continuation-in-part of application No. 15/792,672, filed on Oct. 24, 2017, now Pat. No. 10,529,439.

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1048* (2013.01); *G11C 29/42* (2013.01);
(Continued)

(58) Field of Classification Search
CPC .......... G06F 11/1068; G11C 11/1673; G11C 11/1675; G11C 29/52; G11C 11/1653; G11C 14/0036; G11C 14/0081
(Continued)

(56) References Cited

U.S. PATENT DOCUMENTS

| 1,000,204 A | 8/1911 | Idan Alrod |
| 4,597,487 A | 7/1986 | Crosby et al. |

(Continued)

FOREIGN PATENT DOCUMENTS

| CA | 2766141 | 1/2011 |
| CN | 105706259 | 6/2016 |

(Continued)

OTHER PUBLICATIONS

US 7,026,672 B2, 04/2006, Grandis (withdrawn)
(Continued)

*Primary Examiner* — Guy J Lamarre
*Assistant Examiner* — Osman M Alshack

(57) ABSTRACT

A method for correcting bit defects in an STT-MRAM memory is disclosed. The method includes reading a codeword in the STT-MRAM memory, wherein the STT-MRAM memory includes a plurality of codewords, wherein each codeword includes a plurality of redundant bits. Further, the method includes mapping defective bits in the codeword to redundant bits of the plurality of redundant bits based on a mapping scheme, wherein the mapping scheme is operable to determine a manner in which the defective bits in the codeword are to be mapped to the redundant bits. Finally, the method includes replacing the defective bits in the codeword with corresponding mapped redundant bits.

19 Claims, 12 Drawing Sheets

(51) Int. Cl.
  *G11C 29/52* (2006.01)
  *G11C 29/42* (2006.01)
  *G11C 11/16* (2006.01)
  *G11C 29/04* (2006.01)

(52) U.S. Cl.
  CPC .......... *G11C 29/52* (2013.01); *G11C 11/1653* (2013.01); *G11C 11/1673* (2013.01); *G11C 11/1675* (2013.01); *G11C 2029/0411* (2013.01)

(58) Field of Classification Search
  USPC ................................ 714/763, 764, 765, 766
  See application file for complete search history.

(56) References Cited

U.S. PATENT DOCUMENTS

| | | | |
|---|---|---|---|
| 5,153,880 A | 10/1992 | Owen et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Zlonczewski |
| 5,732,016 A | 3/1998 | Chen et al. |
| 5,751,647 A | 5/1998 | O'Toole |
| 5,754,753 A | 5/1998 | Smelser |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,055,204 A | 4/2000 | Bosshart |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,181,614 B1 | 1/2001 | Aipperspach et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,393,504 B1 | 5/2002 | Leung et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,531,339 B2 | 3/2003 | King et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,363 B1 | 11/2005 | Huai |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 6,996,017 B2 | 2/2006 | Scheuerlein et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,058,782 B2 | 6/2006 | Henderson et al. |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,218,559 B2 | 5/2007 | Satoh |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |

(56) References Cited

U.S. PATENT DOCUMENTS

| | | |
|---|---|---|
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura et al. |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,238,149 B2 | 8/2012 | Shih et al. |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,296,606 B2 | 10/2012 | Blodgett |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,381 B2 | 7/2013 | Kuroiwa et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,001,550 B2 | 4/2015 | Lung |
| 9,019,754 B1 | 4/2015 | Bedeschi |
| 9,019,771 B2 | 4/2015 | Lung et al. |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |

(56) References Cited

U.S. PATENT DOCUMENTS

| | | |
|---|---|---|
| 9,196,332 B2 | 11/2015 | Zhang et al. |
| 9,229,306 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,363,036 B1* | 6/2016 | Zhang .................. H04L 1/0009 |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2001/0016061 A1* | 8/2001 | Shimoda .............. G06T 7/0004 382/149 |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0115538 A1* | 6/2003 | Derner ................ G06F 11/1008 714/773 |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2006/0271755 A1 | 11/2006 | Miura |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0211842 A1* | 8/2010 | Moon .................. H04L 1/1819 714/748 |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2011/0310691 A1 | 12/2011 | Zhou et al. |
| 2011/0320696 A1 | 12/2011 | Fee et al. |
| 2012/0052258 A1 | 3/2012 | Op DeBeeck et al. |
| 2012/0069649 A1 | 3/2012 | Ranjan et al. |

(56) References Cited

U.S. PATENT DOCUMENTS

| | | |
|---|---|---|
| 2012/0155156 A1 | 6/2012 | Watts |
| 2012/0155158 A1 | 6/2012 | Higo |
| 2012/0159281 A1* | 6/2012 | Shalvi .................. G06F 11/1044 714/755 |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0107611 A1* | 5/2013 | Cai ........................ G11C 11/161 365/158 |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0336060 A1* | 12/2013 | Arakawa ................ G11C 16/06 365/185.09 |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0089762 A1 | 3/2014 | Pangal et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0143187 A1 | 5/2015 | Mateescu et al. |
| 2015/0143343 A1 | 5/2015 | Weiss et al. |
| 2015/0149873 A1* | 5/2015 | Cai ........................ H03M 13/458 714/773 |
| 2015/0154116 A1 | 6/2015 | Dittrich et al. |
| 2015/0206569 A1 | 7/2015 | Bose et al. |
| 2015/0279904 A1 | 10/2015 | Pinarbasi et al. |
| 2015/0311920 A1* | 10/2015 | Wang .................... H03M 13/1545 714/764 |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0093439 A1* | 3/2017 | Motwani ............... H03M 13/45 |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0322847 A1* | 11/2017 | Park ...................... G06F 11/2058 |
| 2017/0329667 A1* | 11/2017 | Hirano ................... H03M 13/152 |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz |
| 2018/0248113 A1 | 8/2018 | Pinarbasi et al. |
| 2018/0331279 A1 | 11/2018 | Shen |
| 2019/0044538 A1* | 2/2019 | Palangappa ........ H03M 13/1111 |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 5297195 A | 4/2009 |
| JP | 2013-012546 | 1/2013 |
| JP | 2014-039061 | 2/2014 |
| JP | 5635666 | 12/2014 |
| JP | 2015-002352 | 1/2015 |
| KR | 960002014 B1 | 2/1996 |
| KR | 100519897 A | 9/2003 |
| KR | 101373183 A | 7/2009 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)
Bhatti Sabpreet et al., "Spintronics Based Random Access Memory: a Review," Material Today, Nov. 2107, pp. 530-548, vol. 20, No. 9, Elsevier.
Helia Naemi, et al., "STTRAM Scaling and Retention Failure," Intel Technology Journal, vol. 17, Issue 1, 2013, pp. 54-75 (22 pages).
S. Ikeda, et al., "A Perpendicular-Anisotropy CoFeB—MgO Magnetic Tunnel Junction", Nature Materials, vol. 9, Sep. 2010, pp. 721-724 (4 pages).
R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).
K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).
Kirsten Martens, et al., "Thermally Induced Magnetic Switching in Thin Ferromagnetic Annuli", NSF grants PHY-0351964 (DLS), 2005, 11 pages.
Kristen Martens, et al., "Magnetic Reversal in Nanoscopic Ferromagnetic Rings", NSF grants PHY-0351964 (DLS) 2006, 23 pages.
"Magnetic: Technology Spintronics, Media and Interface", Data Storage Institute, R&D Highlights, Sep. 2010, 3 pages.
Daniel Scott Matic, "A Magnetic Tunnel Junction Compact Model for STT-RAM and MeRAM", Master Thesis University of California, Los Angeles, 2013, pp. 43.

* cited by examiner

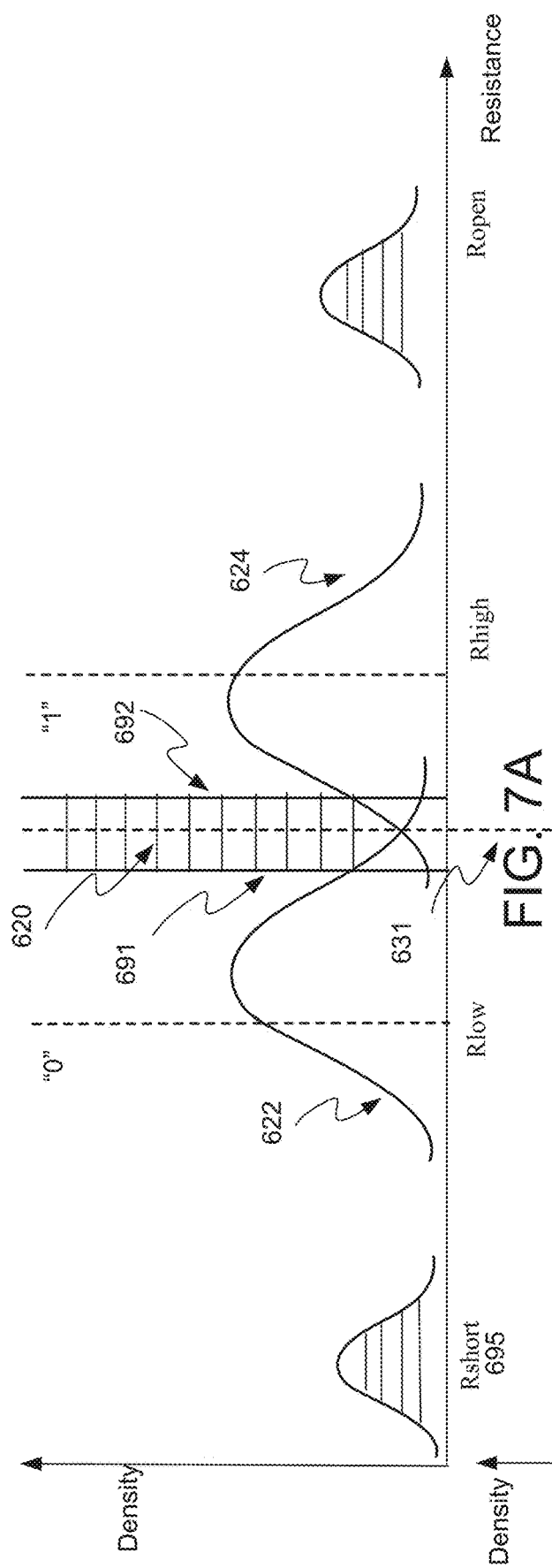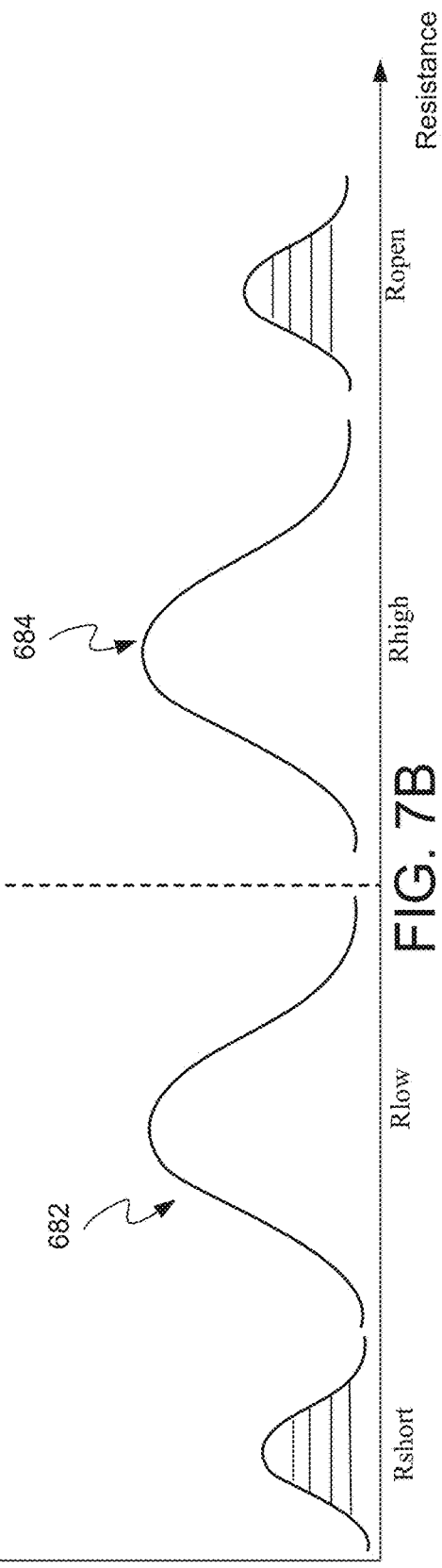

OVER-VOLTAGE WRITE OPERATION OF TUNNEL MAGNET-RESISTANCE ("TMR") MEMORY DEVICE AND CORRECTING FAILURE BITS THEREFROM BY USING ON-THE-FLY BIT FAILURE DETECTION AND BIT REDUNDANCY REMAPPING TECHNIQUES

CROSS-REFERENCE TO RELATED APPLICATIONS

The present application is a Continuation-in-Part of, claims the benefit of and priority to U.S. application Ser. No. 15/792,672, filed Oct. 24, 2017, entitled "ON-THE-FLY BIT FAILURE DETECTION AND BIT REDUNDANCY REMAPPING TECHNIQUES TO CORRECT FOR FIXED BIT DEFECTS" and hereby incorporated by reference in its entirety.

FIELD

The present patent document relates generally to random access memory (RAM). More particularly, the present patent document relates to failure detection and correction operations in magnetoresistive random-access-memory ("MRAM"). The methods and devices described herein are particularly useful in spin-transfer torque magnetic memory (STT-MRAM) devices.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction ("MTJ"). FIG. 1 illustrates an exemplary MRAM cell 110 comprising a MTJ 120. In general, one of the plates has its magnetization pinned (i.e., a "reference layer" or "fixed layer" 130), meaning that this layer has a higher coercivity than the other layer and requires a larger magnetic field or spin-polarized current to change the orientation of its magnetization. The second plate is typically referred to as the free layer 140 and its magnetization direction can be changed by a smaller magnetic field or spin-polarized current relative to the reference layer.

MRAM devices can store information by changing the orientation of the magnetization of the free layer. In particular, based on whether the free layer is in a parallel or anti-parallel alignment relative to the reference layer, either a "1" or a "0" can be stored in each MRAM cell as shown in FIG. 1. Due to the spin-polarized electron tunneling effect, the electrical resistance of the cell change due to the orientation of the magnetic fields of the two layers. The electrical resistance is typically referred to as tunnel magnetoresistance (TMR) which is a magnetoresistive effect that occurs in a MTJ. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

MRAM devices are considered as the next generation structures for a wide range of memory applications. MRAM products based on spin torque transfer switching are already making its way into large data storage devices. Spin transfer torque magnetic random access memory ("STT-MRAM"), such as the one illustrated in FIG. 1, or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

Spin transfer torque magnetic random access memory ("STT-MRAM") has an inherently stochastic write mechanism, wherein bits have certain probability of write failure on any given write cycle. The write failures are most generally random, and have a characteristic failure rate. A high write error rate (WER) may make the memory unreliable. The error rate can typically increase with age and increased use of the memory. Bit-errors can result in system crashes, but even if a bit-error does not result in a system crash, it may cause severe problems because the error can linger in the system causing incorrect calculations and multiply itself into further data. This is problematic especially in certain applications, e.g., financial, medical, automotive, etc. and is generally commercially unacceptable. The corrupted data can also propagate to storage media and grow to an extent that is difficult to diagnose and recover.

Accordingly servers and other high reliability environments have conventionally integrated Error Correcting Code (ECC) into their memory subsystems to protect against the damage caused by such errors. ECC is typically used to enhance data integrity in error-prone or high-reliability systems. Workstations and computer server platforms have buoyed their data integrity for decades by adding additional ECC channels to their data buses.

Typically ECC adds a checksum stored with the data that enables detection and/or correction of bit failures. This error correction can be implemented, for example, by widening the data-bus of the processor from 64 bits to 72 bits to accommodate an 8-bit checksum with every 64-bit word. The memory controller will typically be equipped with logic to generate ECC checksums and to verify and correct data read from the memory by using these checksums. In conventional memories using STT-MRAM error correction an error correcting code (ECC), e.g., BCH (Bose-Chaudhuri-Hocquenghem) is used to correct errors.

While conventional error correction, e.g., ECC are effective, they have certain drawbacks. For example, the error correction using ECC is not performed in real-time. In other words, the ECC correction may be performed during a read operation, but the error is not corrected as the data is written into the STT-MRAM memory cell.

Further, other conventional error correction schemes may require considerable overhead because the addresses/locations of all the bad bits in the memory chip need to be stored prior to performing the correction. The Content Addressable Memories (CAMs) required to store such addresses and locations occupy significant surface area and are expensive because of the high overhead involved in saving the bit addresses/locations for all the failing bits. Storing each address of a defective bit in a CAM also acts as a limit on the number of addresses that can potentially be stored. Further, storing addresses of bad bits and then replacing them with good bits is also not an optimal scheme for STT-MRAM memories because the defect rate is typically high and too much memory would be required to store the addresses of all the bad bits. Also, this error mitigation scheme does not work for defects that are discovered on-the-fly (e.g. replacing the bad bits with good bits may have only happened at the tester phase in manufacturing).

Further, typically, error schemes like ECC can detect and correct errors during a read operation, but it does not write the data back into the memory array. This behavior causes the error to stay resident inside the memory array across multiple accesses and may contribute to a memory failure at a later time when additional errors occur. For example, if the memory is used for longer periods of time, there is an increased probability of a second failure occurring in the same 'word' as a first failure. The first failure may lie silently for years as the internal ECC logic repairs the error every time the word is read. When a second (or third or fourth . . . ) error hits the same word, the internal ECC circuitry is unable to repair the word and corrupted read data is provided to the system.

Additionally, ECC is not efficient for correcting high fixed defect rates. This is particularly problematic for memories comprising STT-MRAM that typically have higher failure rates as compared to other memories. FIG. 2 illustrates the number of codewords with less than 1 bit ECC left reserved as a function of the defect rate. As seen in FIG. 2, for a 1% defect rate, using a BCH-3 ECC scheme, over a 100 words need repair. Conventionally, ECC is appropriate for applications where the defect rates are approximately 50 parts per million (ppm) or less. For memories with higher defect rates ECC and other error correction schemes become problematic. Accordingly, in memory applications comprising STT-MRAM where defect rates are higher, using only conventional error mitigation schemes like ECC results in inefficiencies.

BRIEF SUMMARY OF THE INVENTION

Accordingly, a need exists for a system and method that provides real-time detection and correction of STT-MRAM memory cells and that does not require storing any defective bit locations. In one embodiment, the present invention provides an effective method of replacing bit defects using redundant bits added to each codeword of the memory without incurring a large overhead to peripheral circuits. Rather than storing a map of the locations of the bad bits, embodiments utilize an algorithm to map bad bits of a particular codeword to the associated redundancy bits allocated to the codeword.

In one embodiment, the present invention comprises a memory wherein multiple redundant bits are added to each codeword of the memory. In other words, each codeword of the memory comprises multiple redundant bits, e.g., 4, 6, 8 or more redundant bits per word. Prior to performing a write operation during memory usage, a codeword is read and any shorted (short-circuited) or open (open-circuited) bits in the codeword are mapped out on-the-fly. Any shorted or open bits in the codeword that are defective are replaced with one of the redundant bits in accordance with a mapping algorithm. The write operation is then executed with the redundant bits used in place of the defective bits. In other words, instead of using the defective bits, the correct data is written into one of the redundant bits for that codeword. In this way, the defects are detected and corrected in real-time using embodiments of the present invention.

In one embodiment, the redundant bits are also used to correct defective bits when performing a read operation. During a read operation, a codeword is simultaneously read and any shorted or open bits in the word are on-the-fly mapped out. The defective bits in the word are replaced using the redundant bits using the same mapping scheme or algorithm that was used in the prior write operation. It is appreciated that once the defective bits are replaced in accordance with the above technique, ECC algorithms can still be applied to the resultant word to detect and correct for transient bit errors that may exist in the data word in accordance with embodiments of the present invention.

In one embodiment, a method for correcting bit defects in a STT-MRAM memory is disclosed. The method comprises executing a read before write operation in the STT-MRAM memory, wherein the STT-MRAM memory comprises a plurality of codewords, wherein each codeword comprises a plurality of redundant bits. The read before write operation comprises reading a codeword and on-the-fly mapping defective bits in the codeword. Further, the method comprises replacing the one or more defective bits in the codeword with a corresponding one or more redundant bits and executing a write operation with corresponding redundant bits in place of the defective bits. The selection of the redundant bits to use in place of the defective bits in the codeword is performed in accordance with a defect bit mapping scheme.

In another embodiment, a method for correcting bit defects in a STT-MRAM memory is discussed. The method comprises executing a read operation in the STT-MRAM memory, wherein the STT-MRAM memory comprises a plurality of codewords, wherein each codeword comprises a plurality of redundant bits, and wherein the read operation comprises: (a) reading a codeword; and (b) mapping defective bits in the codeword. Further, the method comprises replacing the one or more defective bits in the codeword with a corresponding one or more redundant bits, wherein the defective bits are replaced with the redundant bits based on relative positions of the defective bits in accordance with a mapping scheme.

In a different embodiment, an apparatus for correcting bit defects in a STT-MRAM memory is disclosed. The apparatus comprises a controller and an STT-MRAM memory comprising a plurality of codewords, wherein each codeword comprises a plurality of redundant bits, and wherein the controller is configured to perform a write operation, wherein the write operation comprises executing a read before write operation in the STT-MRAM memory. The read before write operation comprises: (a) reading a codeword; and (b) mapping on-the-fly defective bits in the codeword to redundant bits allocated to the codewords. Further, the write operation comprises replacing the one or more defective bits in the codeword with a corresponding one or more redundant bits and executing a write operation with corresponding redundant bits in place of the defective bits.

Embodiments of the present invention include any of the above described embodiments in combination with performing ECC error correction on the read data word to defect and correct for transient errors therein.

In one embodiment, a method for correcting bit defects in an STT-MRAM memory is disclosed. The method comprises reading a codeword in the STT-MRAM memory, wherein the STT-MRAM memory comprises a plurality of codewords, wherein each codeword comprises a plurality of bits and a plurality of redundant bits. The method also comprises mapping defective bits in the plurality of bits of the codeword to redundant bits of the plurality of redundant bits based on a mapping scheme, wherein the mapping scheme is operable to determine a manner in which the defective bits in the codeword are to be mapped to the redundant bits. Further, based on the mapping, the method comprises using mapped redundant bits in lieu of the defective bits in the codeword.

In another embodiment, a method for correcting bit defects in an STT-MRAM memory is disclosed. The method comprises reading a codeword in the STT-MRAM memory, wherein the STT-MRAM memory comprises a plurality of codewords, wherein each codeword comprises a respective plurality of bits and a respective plurality of redundant bits. Further, the method comprises mapping each defective bit in the codeword to a respective redundant bit of the plurality of redundant bits in accordance with a mapping scheme, wherein the mapping scheme is operable to determine a manner in which defective bits of the codeword are to be mapped to redundant bits of the codeword. The method also comprises replacing the defective bits of the codeword with redundant bits of the plurality of redundant bits, wherein the defective bits are replaced with the redundant bits based on relative positions of the defective bits in accordance with the mapping scheme.

In another embodiment, an apparatus for correcting bit defects in an STT-MRAM memory is disclosed. The apparatus comprises a processor and an STT-MRAM memory comprising a plurality of codewords, wherein each codeword comprises a respective plurality of bits and a respective plurality of redundant bits. The processor is configured to read a codeword in the STT-MRAM memory and map defective bits in the codeword to redundant bits of the plurality of redundant bits based on a mapping scheme, wherein the mapping scheme is operable to determine a manner in which the defective bits in the codeword are to be mapped to the redundant bits. Further, the processor is configured to replace the defective bits in the codeword with corresponding redundant bits as mapped.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 7A graphically illustrates the manner in which the distribution of the resistance states across an STT-MRAM chip array wherein there is overlap between the high and low resistance states.

FIG. 7B graphically illustrates the manner in which the distribution of the resistance states across an STT-MRAM chip array changes by shorting marginal TMR bits or by reducing TMR requirements for the sense amplifiers in accordance with embodiments of the present invention.

DETAILED DESCRIPTION OF THE INVENTION

Figure 1:
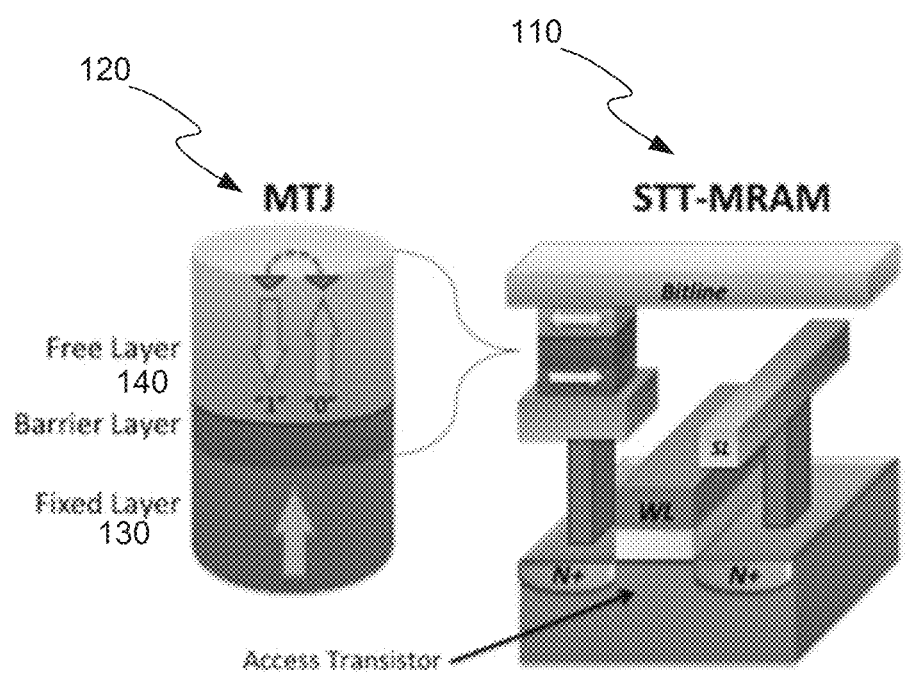
FIG. 1 illustrates an exemplary MRAM cell comprising a magnetic-tunnel-junction.
Figure 2:
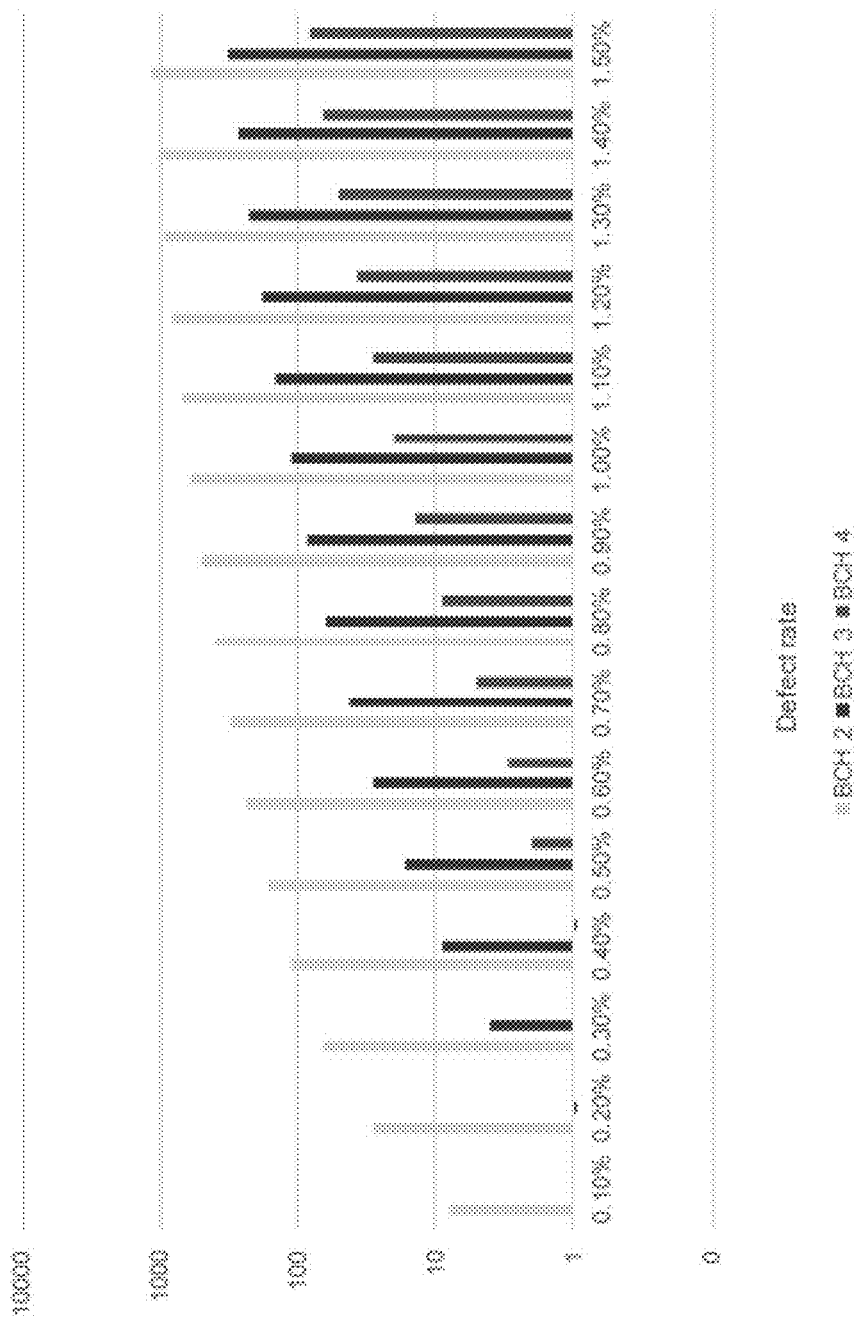
FIG. 2 illustrates the number of codewords with less than 1 bit ECC left reserved as a function of the defect rate.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

Over-Voltage Write Operation of TMR Memory Device and Correcting Failure Bits Therefrom by Using On-the-Fly Bit Failure Detection and Bit Redundancy Remapping Techniques Embodiments of the present invention provide real-time detection and correction of MRAM memory cells, and in particular, STT-MRAM cells. In one embodiment, the present invention provides an effective method of replacing defects using redundant bits added to each codeword of the memory without incurring a large overhead to peripheral circuits.

As used herein, the term "data word" shall apply to the informational bits that are to be written to a memory cell or read from a memory cell. The term "codeword" shall apply to the memory storage elements that store the data word. The term "redundant bits" shall apply to additional memory storage elements that each codeword is supplemented with to store the correct state for defective bits within the associated codeword.

As explained above, conventional methods of error correction have shortcomings that make them less efficient especially when addressing higher error rates for STT-MRAM. For example, the error correction may not be performed in real time. Further, the error correction scheme may be able to detect and correct errors during a read operation, but it does not write the correct data back into the memory array. This behavior causes the error to stay resident inside the memory array across multiple accesses and may contribute to a memory failure at a later time when additional errors occur.

Additionally, conventional error correction schemes are not efficient for correcting high fixed defect rates. This is particularly problematic for memories comprising STT-MRAM that typically have higher failure rates as compared to other memories. One reason conventional schemes are inefficient for correcting high defect rates is because of the high overhead required to store addresses of all the defective bit locations. Accordingly, as described above, conventional defective bit mapping and replacement schemes consume a significant amount of space, power and speed. With the defect rates of STT-MRAM, the overhead associated with storing addresses for all the defective bit locations would be prohibitively high.

In order to address the shortcomings of conventional error correction schemes, embodiments of the present invention comprise a memory wherein multiple redundant bits are added to each codeword of the memory. In other words, each codeword of the memory comprises multiple redundant bits, e.g., 4, 6, 8 or more redundant bits per word.

Figure 3:
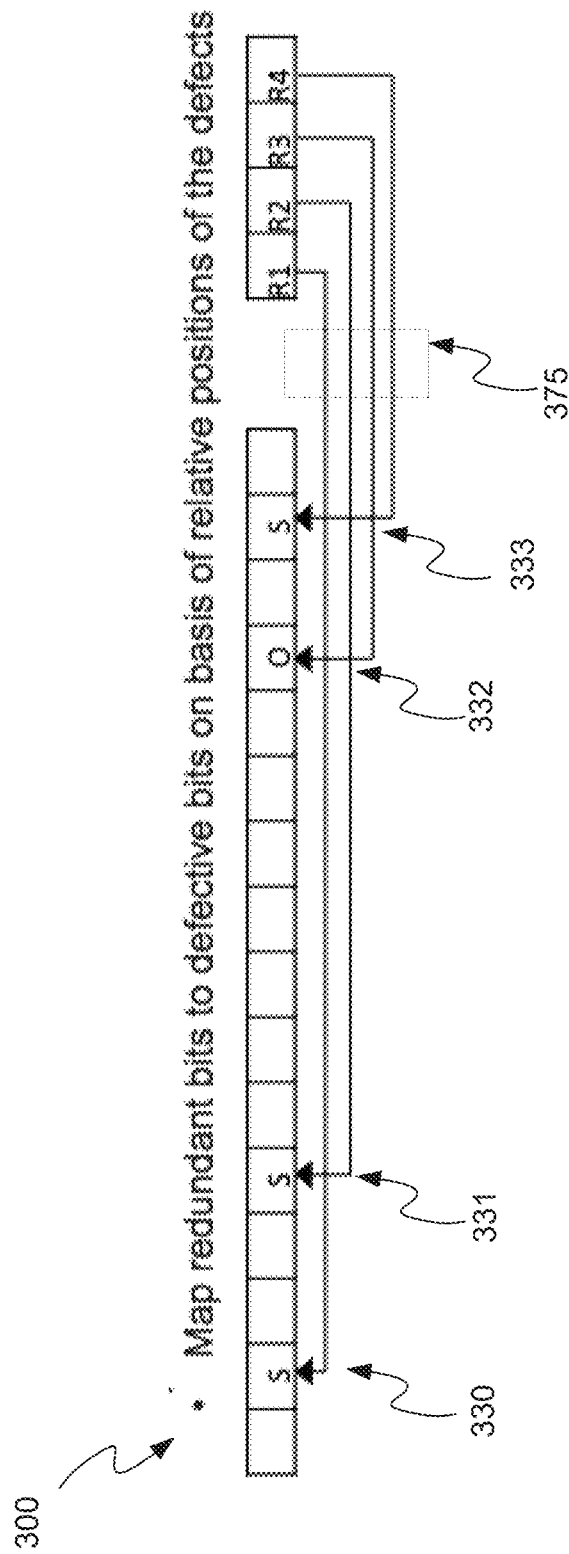
FIG. 3 illustrates the manner in which redundant bits are mapped to defective bits in accordance with an embodiment of the present invention.

FIG. 3 illustrates the manner in which redundant bits are mapped to defective bits in accordance with an embodiment of the present invention. FIG. 3 illustrates an exemplary word 300 that comprises 4 defective bits, namely, bit 330 (short circuit), bit 331 (short circuit), bit 332 (open circuit) and bit 333 (short circuit). Note that embodiments of the present invention are particularly suited for correcting defects related to open circuits ("opens") and short circuits ("shorts"), e.g., defective bits. For example, short circuited bits are a common occurrence in MRAMs and, accordingly, embodiments of the present invention provide an effective way for curing bit defects related to short circuits. Codeword 300 also comprises 4 redundant bits, R1, R2, R3 and R4 associated with codeword 300. Typically, each codeword in the memory will comprise the same number of additional redundant bits.

Prior to performing a write operation to a codeword, embodiments of the present invention would first read the codeword on which the write operation is to be performed. For example, the reading may be in accordance with a read-before-write (RBW) operation. Accordingly, codeword 300 is read and the shorted (short-circuited) or open (open-circuited) bits in the codeword are mapped out. In other words, the read operation maps out the locations of the defective bits 330, 331, 332 and 333 on-the-fly. Note that the mapping of the defective bits is conducted simultaneously with the read operation. In one embodiment, the mapping may be performed substantially simultaneously with the read operation, e.g., in the same cycle with a slight delay or in a subsequent cycle.

The defective bits can be identified by their resistance which is detected by sense amplifiers used during the read. The codeword is read and the mapping of the defective bits is done simultaneously to avoid paying a time penalty. Further, note that performing a read before the write is advantageous because the read cycle can be used to determine which bits need to change when performing the write. Accordingly, a power savings can also result from only writing the bits in a codeword that need to change. In other words, during the write cycle, only the bits that need to change will be flipped.

Note that in rare instances it may not be efficient to perform a read prior to a write. In such cases, the mapping scheme that was determined in a prior read cycle may, in one embodiment, be used to perform the write operation (without conducting an immediately preceding read), e.g., where the last read was performed for the same location prior to attempting a write operation.

In one embodiment, a verify operation is performed after the write to ensure that no endurance fails happened during the write. If an endurance failure, e.g., a bit shorting during the write operation, etc. occurs during the write operation, it will trigger a failure during the verify operation. In other words, it will signal that the write operation failed.

The shorted or open bits in the codeword, namely bits 330-333, are subsequently replaced with one of the redundant bits in accordance with a mapping scheme 375. In other words, the defective bits are swapped out with the redundant bits. In one embodiment, a multiplexer network is used to perform this swapping operation. In one embodiment, one multiplexer network per bank of sense amplifiers would be required to implement this scheme.

In one embodiment, in the mapping scheme 375, the redundant bits are mapped to the defective bits on the basis of relative positions of the defect. In other words, the first redundant bit (the left-most bit R1 in FIG. 3) gets mapped to the earliest defective bit in codeword 300 (bit 330 in FIG. 3). The second redundant bit R2 will get mapped to the second defective bit in codeword 300 (bit 331). Similarly, redundant bit R3 gets mapped to bit 332 while redundant bit R4 gets mapped to bit 333. Another relatively simple mapping scheme would map the redundant bits to the defective bit in a right to left orientation. For example, bit R4 would be mapped to shorted bit 330, bit R3 would be mapped to shorted bit 331, bit R2 would be mapped to open bit 332 and bit R1 will be mapped to shorted bit 333. Because of the relative simplicity of these mapping schemes, they do not require storing any complex algorithms within the memory chip. Note, however, that some logic in the memory chip may need to be dedicated to implement even a simple mapping scheme.

In other embodiments, other replacement schemes or algorithms for mapping redundant bits to the defective bits can also be used to improve efficiency. Such schemes would be more complex than simply mapping bits on the basis of relative positions of the defects and may require programming and storing a corresponding algorithm into the memory chip. In some embodiments, however, the replacement scheme may be simpler schemes that can be implemented with additional logic.

Subsequently, the write operation is then executed with the redundant bits used in place of the defective bits to receive the write data. In other words, instead of using the defective bits, the correct data is written into one of the redundant bits for that codeword. Further, in order to save power, the write is disabled for the defective bits. In other words, the write operation does not attempt to write to the defective bits. In this way, the defects are advantageously detected and corrected in real-time using embodiments of the present invention. The local bit redundancy scheme advantageously replaces defects at the bit level in real-time without incurring a large overhead in peripheral circuits. Unlike prior error correction schemes that incurred a significant overhead as a result of needing to store defective bit addresses to correct at a later time, embodiments of the present invention advantageously correct bit defects in memory without the need for storing any defective bit addressees. Further, unlike prior error mitigation schemes that would perform detection and correction procedures during the testing process prior to shipping, embodiments of the present invention perform detection and correction of errors in real-time (or in situ).

In one embodiment, the RBW operation is performed simultaneously or partially simultaneously with the write operation in order to decrease the overall length of the write operation.

Embodiments of the present invention also advantageously mitigate errors in the memory chip over the lifetime of the chip. In other words, the error correction scheme is not merely limited to a particular duration of time, e.g., during testing of the chip. If a bit in the memory fails after the chip has already shipped and is in use by an end user, the error mitigation scheme will detect the defective bit during a pre-read for a write operation (or a verify operation) and replace the defective bit in the word with a redundant bit. In other words, the error correction scheme of the present invention can detect defective bits on-the-fly over the lifetime of the chip and replace the defective bits with redundant bits (provided there are redundant bits remaining). Note, that it is not uncommon for bits to be shorted out over the lifetime of an MRAM chip. Accordingly, it is advantageous to have an error correction scheme that accommodates defects that develop over time in a chip. If a newly discovered defective bit is present, then the mapping scheme will remap the redundant bits to the defective bits in accordance with the mapping scheme.

By comparison, conventional redundancy schemes store information regarding the locations of the defective bits in CAMs and find and replace the defective portions of the memory only during the testing process. Embodiments of the present invention perform correction over the lifetime of the chip without storing any such locations/addresses of the defective bits. Further, the correction of the present embodiment is performed on-the-fly at read and write speeds. Replacing defective bits over the lifetime of the chip with functional redundant bits also increases the lifetime of the chip. For example, if a bit is shorted after the memory chip has already been shipped, it will simply be replaced by a heretofore unused redundant bit. Accordingly, the lifetime of the chip is increased because a new redundant bit replaces an older bit which became defective during use.

In one embodiment, the redundant bits are also used to correct defective bits when performing a read operation in accordance with a mapping scheme. During a read operation, a codeword is simultaneously read and any shorted or open bits in the word are mapped out based on their resistance. The defective bits in the word are replaced using the redundant bits using the same mapping scheme that was used in the prior write operation in order to determine the data word to be read out. Note that in order to speed up the read operation, both the codeword is simultaneously read and any mapping of shorted and open bits is performed at the same time. If speed is not a consideration, then, in one embodiment, the reading of the codewords and the mapping of the defective bits can be separate operations.

In one embodiment, if a codeword uses up its allocation of redundant bits, it may borrow redundant bits from neighboring words. For example, if 4 redundant bits are allocated per codeword and if a word has more than 4 defective bits, in one embodiment, it may be possible for the codeword to borrow vacant redundant bits from neighboring codewords. This may be possible, for example, if multiple words can be read simultaneously (or in the same cycle). In such cases, redundant bits may be borrowed from other words that are read in the same cycle.

Figure 4:
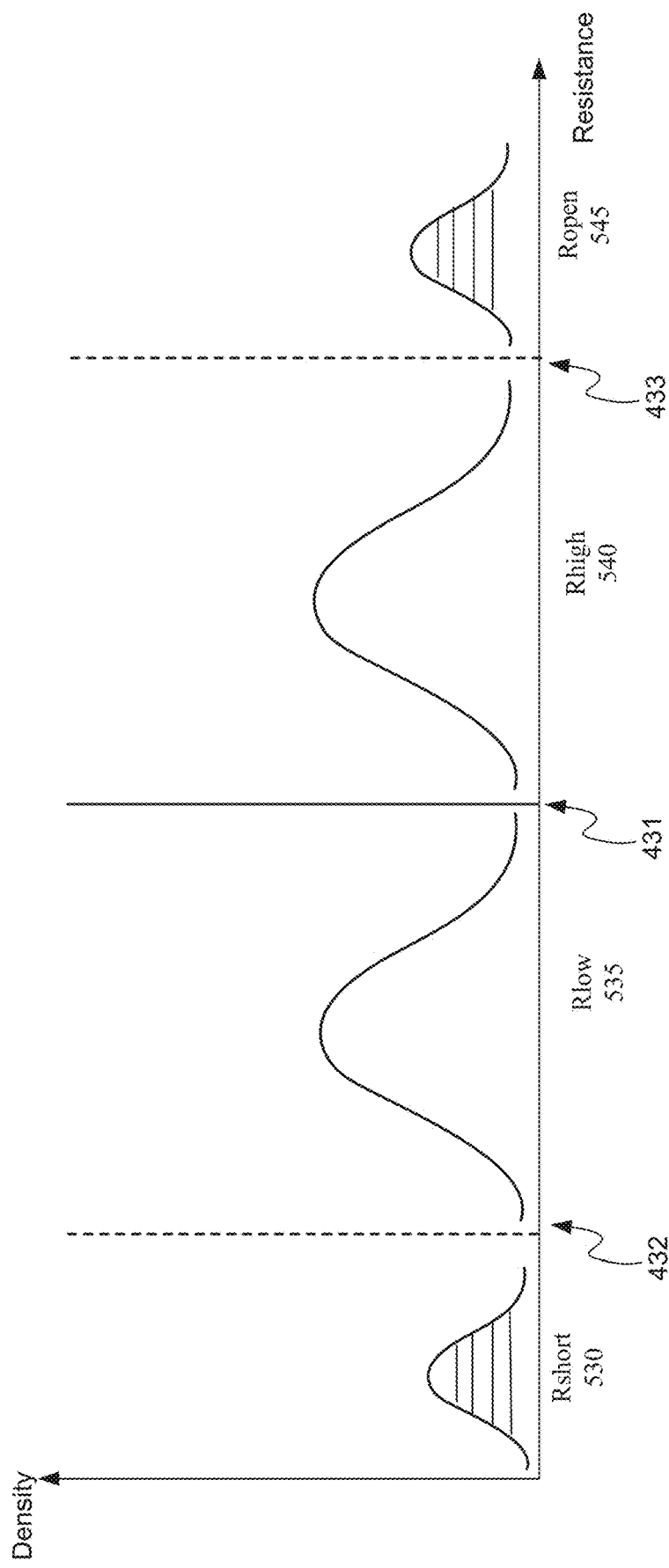
FIG. 4 graphically illustrates the distribution of the resistance states across an STT-MRAM chip array.

FIG. 4 graphically illustrates the distribution of the resistance states across an STT-MRAM chip array. This is a resistance distribution. As discussed above, MRAM devices store information by changing the orientation of the magnetization of the free layer. In particular, based on whether the free layer is in a parallel or anti-parallel alignment relative to the reference layer, either a "1" or a "0" can be stored in each MRAM cell as shown in FIG. 1. Due to the spin-polarized electron tunneling effect, the electrical resistance of the cell change due to the orientation of the magnetic fields of the two layers. The cell's resistance will be different for the parallel and anti-parallel states and thus the cell's resistance can be used to distinguish between a "1" and a "0". Typically, if the free layer is in parallel alignment relative to the reference layer (low resistance state, Rlow 535), this is considered to mean "1" while if alignment is anti-parallel the resistance will be higher (high resistance state, R-high 540) and this means "0."

As seen in FIG. 4, memory cells in the STT-MRAM chip array be distributed so that the cells can typically have one of four resistance states: R-high 540, R-low 535, R-open 545 or R-short 530. Defective bits that are short-circuited (and correspond to R-short 530) or open-circuited (and correspond to R-open 545) can be identified because their resistance will either be significantly lower (in the case of R-short) or higher (in the case of R-open) than the typical resistances of the R-low and R-high states respectively.

In one embodiment, in order for the additional states R-open and R-short to be identified during a typical STT-MRAM read operation, additional sense amplifiers are incorporated into the memory chip to perform the resistance measurements. A sense amplifier is one of the elements which make up the circuitry on a memory chip and are well known. A sense amplifier is part of the read circuitry that is used when data is read from the memory; its role is to sense the low power signals from a bit-line that represents a data bit (1 or 0) stored in a memory cell, and amplify the small voltage swing to recognizable logic levels so the data can be interpreted properly by logic outside the memory.

Conventionally, there is one sense amplifier for each column of memory cells, so there are usually hundreds or thousands of identical sense amplifiers on a modern memory chip. However, in conventional memories, the sense amplifiers may only have a single sense reference. In other words, the sense amplifiers in conventional memories may only be able to distinguish between a "1" and a "0".

Embodiments of the present invention, however, require sensing of additional states (namely R-open and R-short) and, therefore, may require additional sense amplifiers for each column of memory cells so that during a read operation, all four states can be distinguished from each other. As discussed in connection with FIG. 3, a read operation needs to read the bits in the codeword and map out all the defective bits within the codeword. In order for the read operation to distinguish between the four potential states (namely, a "1", a "0", a short circuit and an open circuit), additional sense amplifiers are incorporated in the circuitry for the memory chip. Accordingly, with the additional sense amplifiers, multiple sense points, e.g., sense points 432, 431 and 433 may be detected. To detect the additional sense points, embodiments of the present invention may, for example, require two different extra sense amplifiers per bit (or per column, depending on the structure of the memory). Note that sense point or sense reference 431 can be determined using a simple calculation: ((R-high+R-low)/2).

The various reference points (e.g., 431, 432 and 433) can be set simultaneously so that during a read cycle, the different states can be mapped out at the same time. Alternatively, if time is not a constraint, the different reference points can be set serially so that the detection of the various states is done serially.

Figure 5:
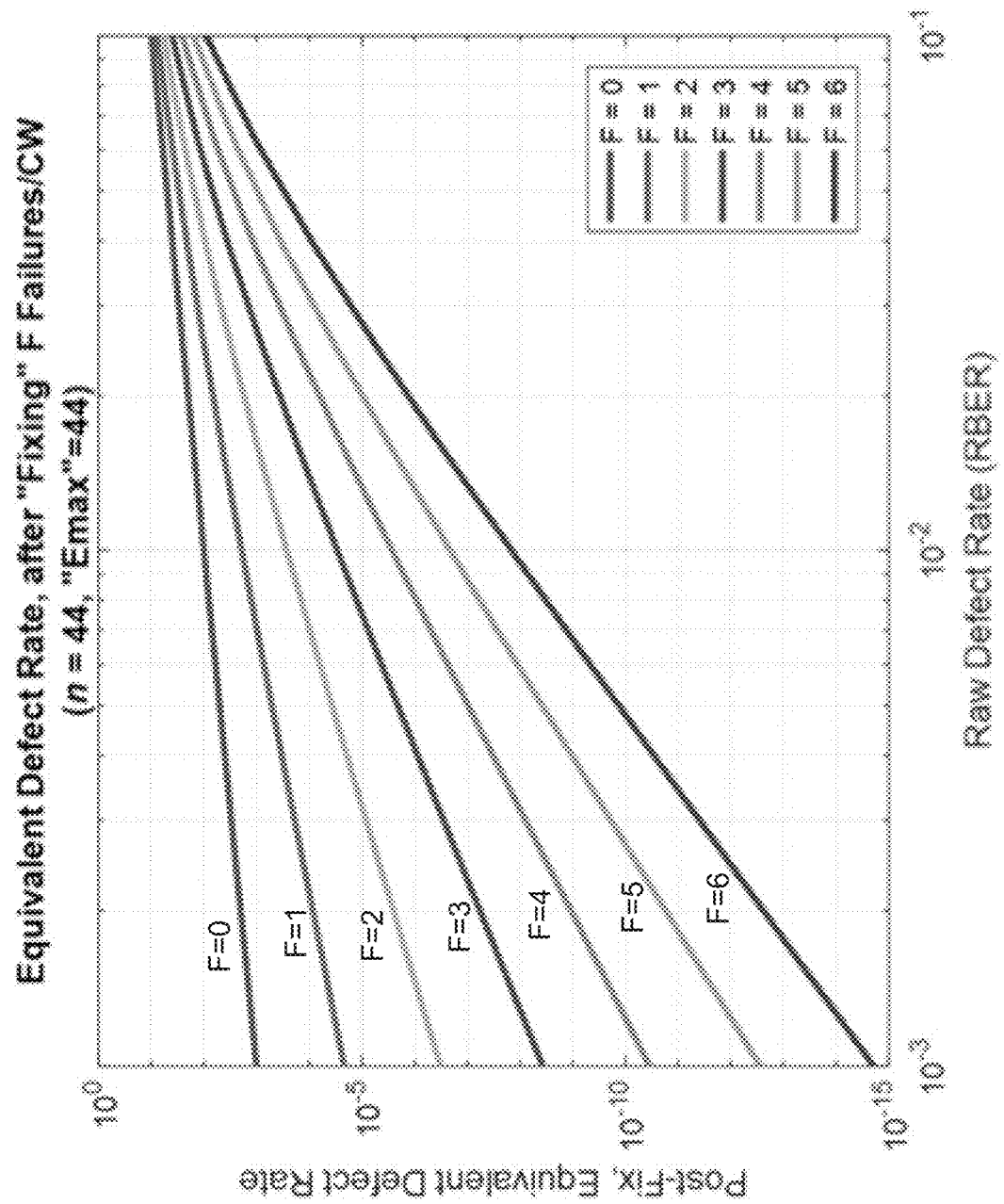
FIG. 5 illustrates the behavior of the defect rate in a memory chip as more redundant bits per word are added in accordance with an embodiment of the present invention.

FIG. 5 illustrates the behavior of the defect rate in a memory chip as more redundant bits per word are added in accordance with an embodiment of the present invention. In FIG. 5, "F" represents the number of redundant bits added per code word. As seen in FIG. 5, when F=4 (each code word has 4 redundant bits), the defect rate falls lower than $10^{-10}$. With additional redundant bits, e.g., 6 bits, the defect rate falls lower than $10^{-15}$ but there will be a trade-off between a low defect rate and efficiency with increasing number of redundant bits because processing a higher number of redundant bits takes longer.

In one embodiment, the redundant bits of the present invention can be combined with other error mitigation schemes to further reduce defect rates. For example, a hybrid scheme may utilize both redundant bits and BCH2 or BCH3 error correction. For example BCH2 can be combined with redundant bits so that each word in the memory comprises 32 data-bits, 12 parity bits for BCH2 and 6 redundant bits. Bit redundancy is used to correct any word that has a defect in it. BCH2 error correction is then used to correct data words which are not completely cleaned up by bit redundancy. The hybrid schemes are also effective because using an ECC scheme, e.g., BCH2, BCH3, Reed Solomon, Hamming code and Low Density Parity Check (LDPC), etc. in conjunction with redundant bits may be able to correct for errors, e.g., write errors, data retention failures, transient errors, etc. that cannot be cleaned up using only redundant bits. Accordingly, while redundant bits may be effective at correcting for hard defects within a codeword, the error correction process can be supplemented with an ECC scheme to correct for other types of errors, e.g., transient errors that are not caused by hard defects. The ECC scheme will typically be applied to a data word after the redundant bit replacement scheme has already been implemented to replace bit defects in the corresponding codeword with corresponding redundant bits. Further, instead of using an expensive type of ECC, e.g., a 4-bit ECC exclusively to correct for errors, embodiments of the present invention supplement the redundant bit scheme with a less expensive type of ECC, e.g., a 2-bit to achieve the same or better results than a prohibitively expensive ECC. In other words, combining the inclusion of redundant bits with other redundancy schemes (e.g., ECC) results in power, time and space savings because less complex redundancy schemes need to be employed.

A typical STT-MRAM may contain certain memory cells that may not clearly fall within any of the states illustrated in FIG. 4. In other words, the resistance of certain STT-MRAM cells may be ambiguous preventing them from being easily classified as either a high, low, short or open. For example, if the resistance of a cell is in close proximity to any of the sense points, e.g., points 432, 432 or 433, it may be difficult to classify the state of that cell. Such defects, which are neither shorts nor open circuits, are not detectable during user read or verify operations. Examples of such defects include stuck bits, waterfalls, shunts and low tunnel magnetoresistance (TMR) bits.

In one embodiment of the present invention, all cells with resistances that cannot be easily classified are converted or forced into short circuited cells during the testing or characterization stage. Shorting such problematic bits allows them to be replaced by redundant bits, thereby, precluding them from being corrected using a more expensive ECC process. In one embodiment, during the testing phase, a test algorithm is executed that determines the number of such bits and converts them into shorts.

For example, there may be certain shunted bits in the region between Rlow 535 and Rshort 530. These bits are not short circuits, however, they are also not completely functional bits. As a result of certain process anomalies, these bits may not be capable of a full swing between Rhigh and Rlow. In other words, while the bits may exhibit some switching behavior, they are not capable of exhibiting a full TMR swing in a way that the sense amplifier can clearly distinguish between the two states of the bit and classify them as either Rhigh or Rlow. In one embodiment, the shunted bits are shorted out so that they can be replaced by a corresponding redundant bit.

In certain cases, there may be defective bits that skew the WER of the MRAM device. For example, in the case of magnetic defects, there may be cases where certain bits have a defect rate that are much higher than the other bits in the MRAM device. One bit in the memory may, for example, have a high defect rate of $10^{-5}$ while other bits in the same device have an average defect rate of $10^{-6}$. In order to prevent the bits with the high defect rate from skewing the WER, in one embodiment, these bits can be shorted out and replaced with redundant bits, e.g., during memory operation.

By way of further example, certain bits may be classified as waterfall bits. These bits are typically stuck bits that do not switch at all either because of a process or magnetic defect. They may be either stuck high or stuck low. These bits may be found in the middle of the distribution, e.g., either in the middle of the Rlow distribution 535 or the middle of the Rhigh distribution 540. Low TMR bits may exhibit the same behavior as waterfall bits. In other words, low TMR bits may also be either stuck high or stuck low. Low TMR bits can also be caused by either a magnetic or process defect. In one embodiment, the waterfall or low TMR bits are shorted out so that they can be replaced by a corresponding redundant bit.

One of the metrics monitored for the bits in an MRAM device is retention. The retention of the bit is related to the stability of the bit. Retention relates to the amount of time that a bit will retain its data. The bits in a memory device may have a retention distribution. Some bits, for example, may retain their data for several hours while some may only retain their information for under an hour. A given application for an MRAM device may, however, require a minimum retention period. For example, a given application may require a minimum retention period of an hour. In one embodiment, all bits that have retention rates below an hour can then be shorted out and replaced by redundant bits. In other words, bits that do not meet the requirements of a particular application can be blown out of the distribution and replaced by the redundant bits.

Typically, bits in a STT-MRAM memory chip will short during a write operation because of the higher voltage employed during a write operation (as compared to a read operation). In certain unlikely instances if a bit shorts during a read operation while the mapping of the defective bits is being performed, it can cause the replacement scheme to malfunction.

Figure 6:
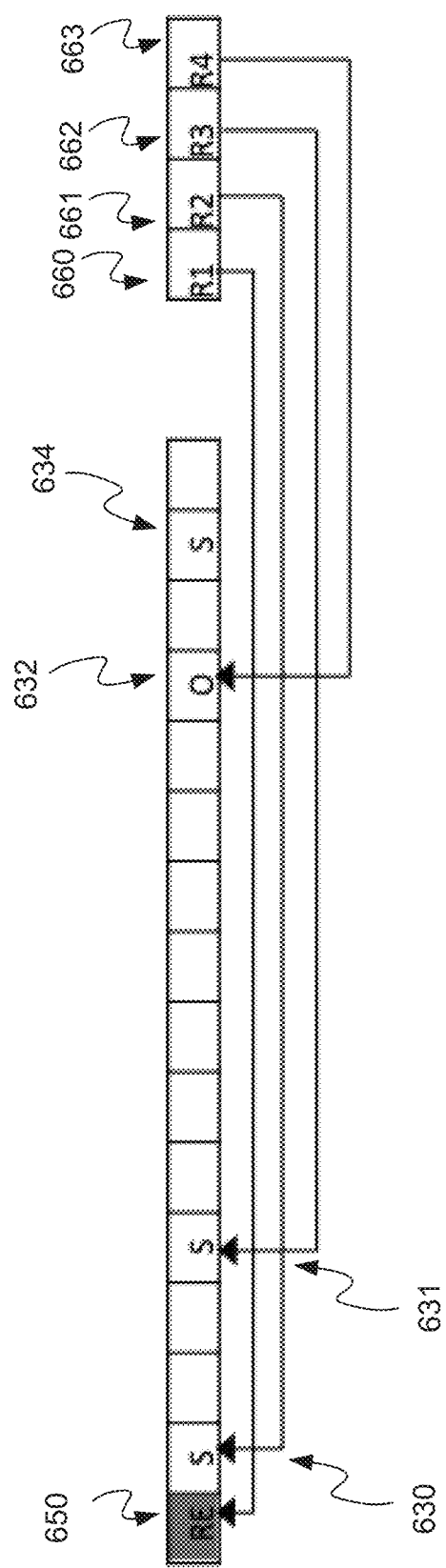
FIG. 6 illustrates the manner in which a malfunction can occur if a bit shorts during a read operation in accordance with an embodiment of the present invention.

FIG. 6 illustrates the manner in which a malfunction can occur if a bit shorts during a read operation in accordance with an embodiment of the present invention. If a defect, e.g., a short 650 appears during a read operation that was not present during an earlier write operation, then all the redundant bits 660-663 can get incorrectly assigned especially if a simple replacement scheme is being followed, e.g., a left to right or right to left replacement scheme based on the relative positions of the defects. For example, if a simple left to right replacement scheme is being followed, then a short 650 that appears during a read operation (but was not present when the data was written) may incorrectly be mapped to redundant bit R1 660. This would result in all the following redundant bits also being incorrectly assigned, e.g., R2 661 would be incorrectly assigned to bit 630 (instead of 631), R3 662 would be incorrectly assigned to bit 631 (instead of 632) and so forth.

To reduce the impact of this issue, a more complex replacement scheme, e.g., replacement scheme 375 can be programmed into the memory chip. As mentioned above, in some embodiments, other replacement schemes or algorithms for mapping redundant bits to the defective bits can also be used to improve efficiency. Such schemes would be more complex than simply mapping bits on the basis of relative positions of the defects and would likely require programming and storing a corresponding algorithm into the memory chip. However, more complex schemes would prevent against problems created as a result of the rare circumstance of a bit shorting during a read operation.

In one embodiment, the replacement scheme may alternate between a left-to-right scheme and a right-to-left scheme. Such a scheme would prevent against all the redundant bits getting misassigned in the case of a bit failure during a read operation. For example, if bit 650 shorts during a read operation, in a scheme that alternates, redundant bit R1 660 would be misassigned to bit 650. However, if the scheme alternates, then redundant bit R4 663 would be swapped with the right-most bit in the codeword, which in this case is, bit 634. Accordingly, instead of all 4 redundant bits being misassigned, only 2 end up being misassigned in a scheme that alternates between the two replacement schemes.

In another embodiment, the replacement scheme may restrict the allocation of redundant bits to designated portions of the code word. For example, for a 32 bit codeword, redundant bit R1 660 may be restricted to defects appearing in the first 8 bits of the codeword, R2 661 may be restricted to defects appearing in the next 8 bits of the codeword, and so forth. While this scheme is effective in restricting the number of redundant bits that may potentially be misaligned if a bit shorts during the read operation, it may be problematic if all the defective bits are lumped together in one of the 8 bit sections.

Similar to a bit shorting during a read operation, it is possible that a bit may short during a write operation after the redundant bits have already been mapped out during the pre-write read operation. To mitigate against this, typically embodiments of the present invention will perform a verify operation following the write. In other words, a write-verify (which effectively is the same as a 'read' operation) can be performed to make sure no bits shorted or otherwise malfunctioned during the write operation. If a malfunction is detected during the verify operation, the entire write operation is performed again (which may include the pre-write read operation for mapping out the redundant bits).

In one embodiment, a verify operation occurs after the re-write also. In another embodiment, if the verify operation fails, the data word is entered into an error cache (or dynamic redundancy register) where it is stored for correcting at a later time. Examples of functionality that enables monitoring performance of a client device are described in U.S. patent application Ser. No. 15/277,799, entitled "DEVICE WITH DYNAMIC REDUNDANCY REGISTERS", filed on 27 Sep. 2016, and which is hereby incorporated by reference in its entirety for all purposes.

If the data word needs to be accessed prior to fixing the malfunction, it is read directly from the cache. In one embodiment, a verify operation occurs after the write to error buffer to ensure that the proper information was written to the error buffer.

In one embodiment, in order to improve read speed, the bit-cell resistance distribution can be cleaned up by shorting marginal TMR bits or by reducing TMR requirements for the sense amplifiers. FIG. 7A graphically illustrates the manner in which the distribution of the resistance states across an STT-MRAM chip array wherein there is overlap between the high and low resistance states. As shown in FIG. 7A, the bit-cell resistance distribution comprises region 620, wherein certain bit-cells in the array have resistances that fall in the region 620. This region is also known as the "margin area." The margin area is typically a bandwidth of resistances centered around reference point 631, wherein a sense amplifier will not be able to accurately distinguish a resistance within the margin area as either Rhigh or Rlow. In other words, typically, bit-cells with resistances that fall within margin area 620 (either directly in the region overlapping the R-low 622 and R-high curves 624 or in close proximity to the overlap region) will likely not be read accurately by a sense amplifier at high speeds. The width of margin area 620 depends on the speed of the sense amplifier. A sense amplifier will typically be unable to discern between a "1" or a "0" for STT-MRAM cells when the bit-cell resistances are within region 620. Such bits are unreliable because they may be detected as either a "0" or "1". In order to avoid the overhead of having an ECC process clean up such ambiguous bits, in one embodiment, all bit-cells with resistances that fall in the overlap region 620 are shorted out.

In one embodiment, the margin area 620 is determined by characterizing the sense amplifier. The width of the margin area is dependent on the speed of the sense amplifier. Characterizing the sense amplifier comprises moving the sense amplifier reference point to the left to determine the Margin High reference point 691. After establishing the Margin High reference point 691, the bits with resistance values higher than the reference point 691 are determined. Subsequently, the sense amplifier reference point is moved to the right to determine the Margin Low reference point 692. After establishing the Margin Low reference point 692, the bits with resistance values lower than the reference point 692 are determined. Thereafter, an XOR is performed between the two sets of results to establish the bits with resistance values that lie between the Margin High reference point 691 and Margin Low reference point 692. The margin bits in between the two reference points can then be shorted out and pushed towards the R-short distribution 695.

FIG. 7B graphically illustrates the manner in which the distribution of the resistance states across an STT-MRAM chip array changes by shorting marginal TMR bits or by reducing TMR requirements for the sense amplifiers in accordance with embodiments of the present invention. When unreliable bits in region 620 are shorted out, the R-low 682 and R-high 684 curves move further apart to where there is no overlapping region anymore. In other words, the sense amplifier window is opened up so a stringent sense amplifier is no longer required to distinguish between a "1" or "0" for ambiguous bits. More stringent sense amplifiers typically require more power and longer evaluation times, so by shorting out the ambiguous bits, the chip conserves power. Further, all the shorted bits can now be corrected by using the redundant bit replacement scheme rather than using costly ECC procedures. And because each codeword in the memory comprises at least 4 redundant bits, it is unlikely that any single codeword will have more than 4 bits shorted out during the process of cleaning up the sense amplifier window.

In one embodiment, the redundant bit replacement scheme of the present invention also results in higher tolerance for write endurance failures. Typically with MRAM, driving the cells at higher voltages at higher speeds results in lower endurance levels. With the bit replacement scheme of the present invention, lower endurance levels can be tolerated because each code word has multiple redundant bits to replace any defective bits. Accordingly, the chip can be allowed to operate at a higher voltage because statistically the error rates do not surpass a critical threshold as a result of the multiple redundant bits being used to replace any defects occurring on the fly. Further, because embodiments of the present invention can be used to correct bit defects over the lifetime of the chip, there is no time limit on the efficacy of the scheme.

Figure 8A:
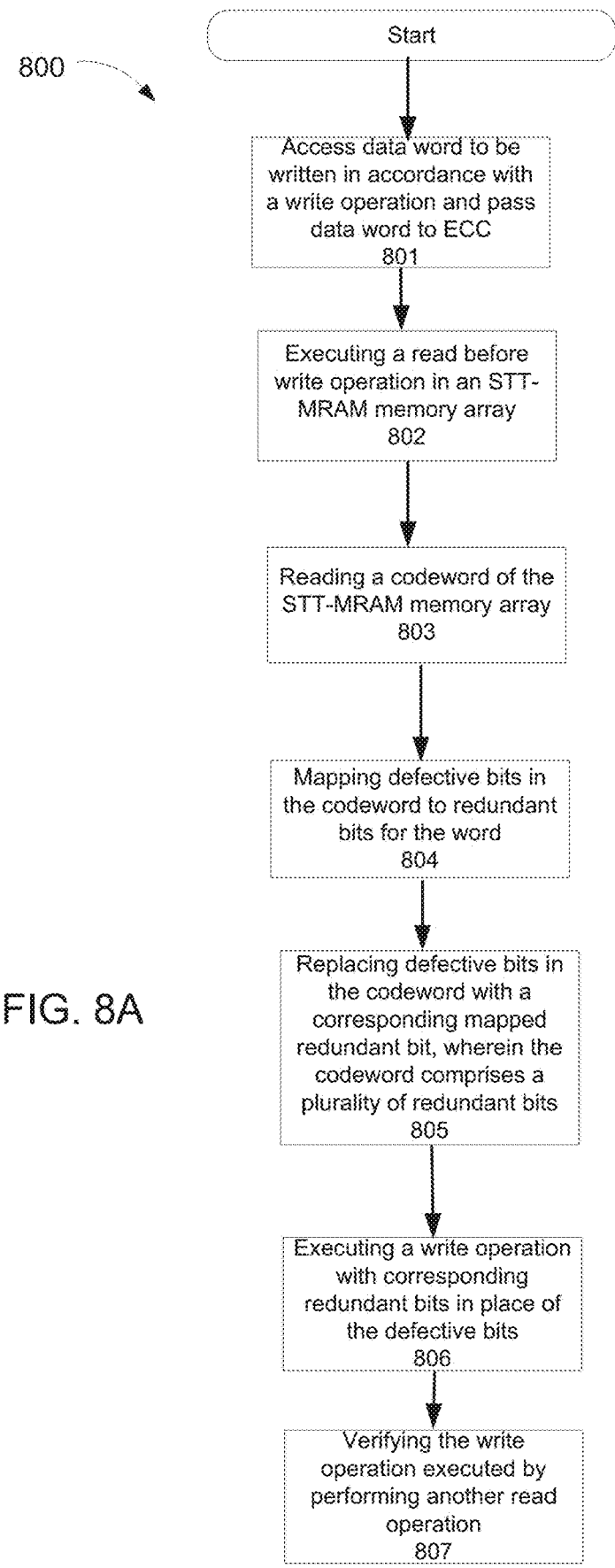
FIG. 8A shows a flowchart of an exemplary method for correcting bit defects in a STT-MRAM memory array during a write operation in accordance with embodiments of the present invention.

FIG. 8A shows a flowchart 800 of an exemplary method for correcting bit defects in a STT-MRAM memory array during a write operation in accordance with embodiments of the present invention.

At step 801, a data word to be written into memory is accessed in accordance with a write operation command. The data word is passed to an ECC hash function, e.g., to determine a checksum.

At step 802, a read-before-write operation is executed on the STT-MRAM memory array, wherein the STT-MRAM memory comprises a plurality of codewords. Further, each codeword comprises a plurality of redundant bits.

At step 803, the read-before-write operation executes by reading a codeword. Subsequently, at step 804, the read-before-write operation maps defective bits in the codeword to redundant bits for the word based on a mapping scheme.

At step 805, the defective bits in the codeword are replaced with a corresponding mapped redundant bit.

At step 806, a write operation is executed with corresponding redundant bits in place of the defective bits. Accordingly, the data word can be saved into the memory using both the codeword and corresponding redundant bits.

At step 807, verification is performed that the write operation executed correctly by performing another read operation to read out the data word stored in the codeword and corresponding redundant bits.

Figure 8B:
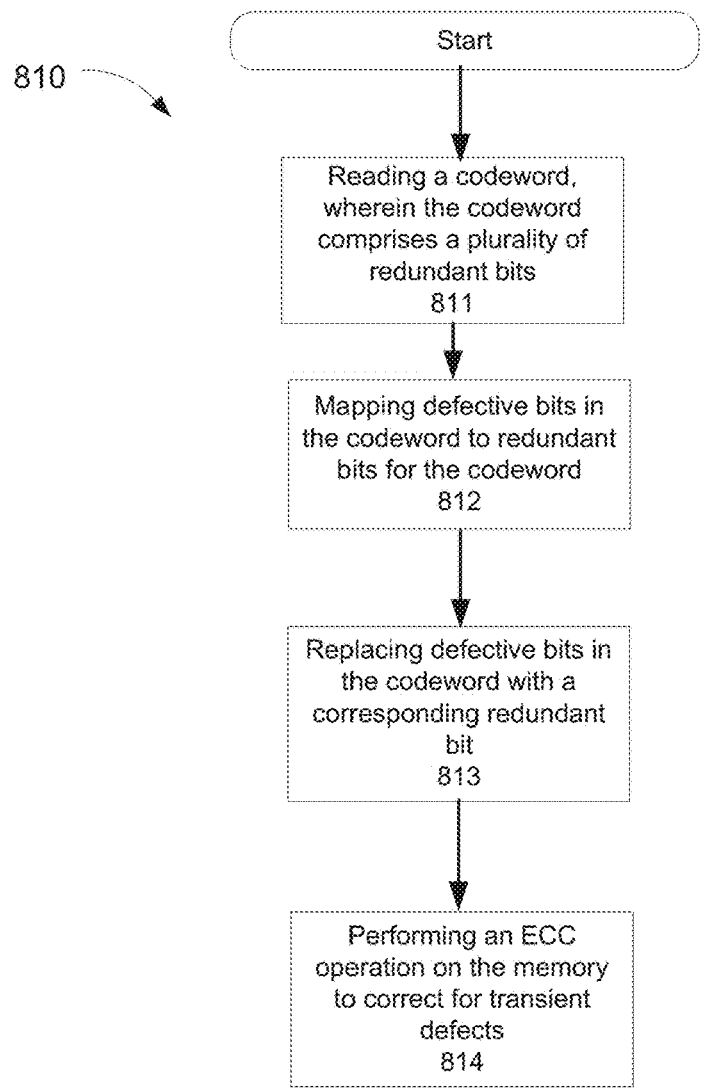
FIG. 8B shows a flowchart of an exemplary method for correcting bit defects in a STT-MRAM memory array during a read operation in accordance with embodiments of the present invention.

FIG. 8B shows a flowchart 810 of an exemplary method for correcting bit defects in a STT-MRAM memory array during a read operation in accordance with embodiments of the present invention.

At step 811, a read operation comprises reading a codeword in an STT-MRAM memory, wherein the STT-MRAM memory comprises a plurality of codewords, wherein each codeword comprises a plurality of redundant bits.

At step 812, the read operation maps defective bits in the codeword to redundant bits for the word based on a mapping scheme.

At step 813, the defective bits in the codeword are replaced with a corresponding redundant bit in accordance with the mapping scheme.

At step 814, an ECC operation is performed on the data word read out to correct for transient defects not corrected using the plurality of redundant bits.

Figure 9:
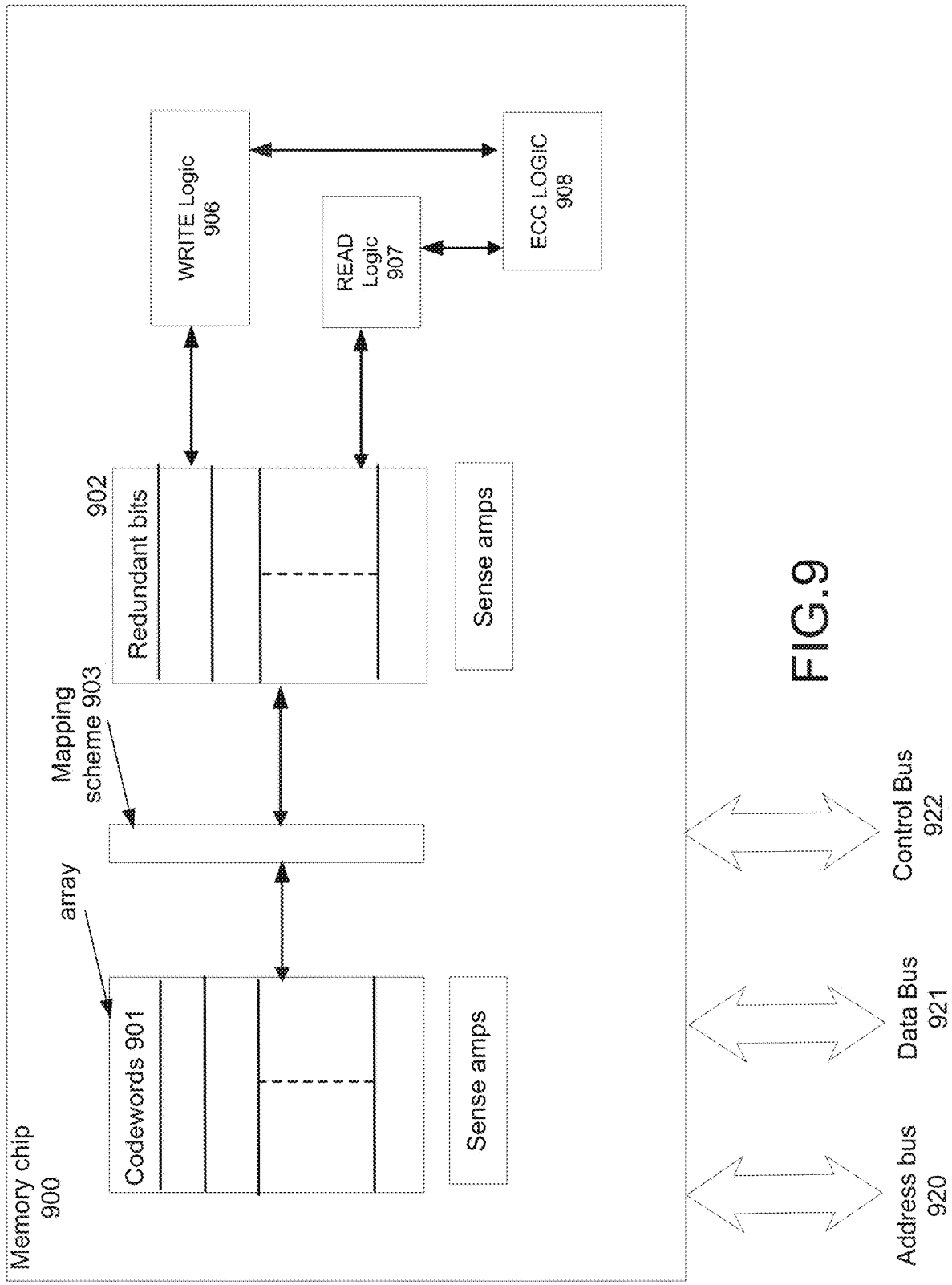
FIG. 9 illustrates an apparatus for correcting bit defects in a STT-MRAM memory array in accordance with embodiments of the present invention.

FIG. 9 illustrates an apparatus for correcting bit defects in a STT-MRAM memory array 900 in accordance with embodiments of the present invention.

Shown in FIG. 9, is the memory array 900 comprising a codewords array 901 with the corresponding redundant bits 902 allocated for each codeword. FIG. 9 also illustrates the logic 903 that implements the mapping scheme between the codewords and the redundant bits.

Write logic 906 implements a method for correcting bit defects in a STT-MRAM memory array during a write operation (as discussed in conjunction with FIG. 8A). Read logic 907 implements a method for correcting bit defects in a STT-MRAM memory array during a read operation (as discussed in conjunction with FIG. 8B).

Further, FIG. 9 illustrates ECC logic 908 that operates in conjunction with the read and write logic. Also, the memory comprises address 920 and data bus lines 921 that communicate with the processor. Further, control bus 922 is illustrates, wherein the control bus would receive commands regarding a read/write operation, etc.

Figure 10:
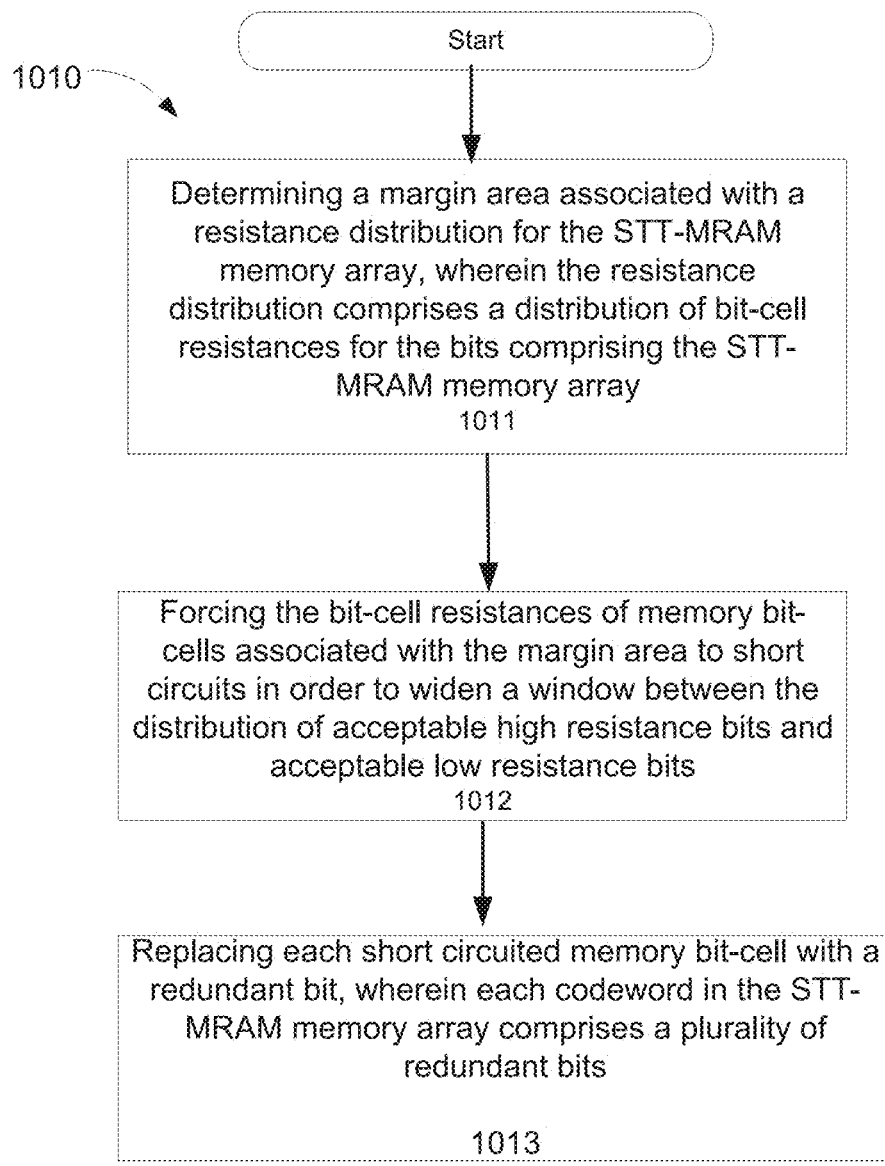
FIG. 10 shows a flowchart 1010 of an exemplary method for correcting bit defects in a STT-MRAM memory array in accordance with embodiments of the present invention.

FIG. 10 shows a flowchart 1010 of an exemplary method for correcting bit defects in a STT-MRAM memory array in accordance with embodiments of the present invention.

At step 1011, a margin area is determined associated with a resistance distribution for a memory array, e.g., STT-MRAM memory array. A read operation is performed on the memory array to characterize the resistance distribution. The resistance distribution comprises a distribution of bit-cell resistances for all bits comprising the STT-MRAM memory array, wherein the distribution of bit-cell resistances comprises a distribution of acceptable high resistance bits and a distribution of acceptable low resistance bits, e.g., regions Rlow and Rhigh shown in FIG. 7A. As discussed in connection with FIGS. 7A and 7B, the bit-cell resistance distribution comprises region 620, wherein certain bit-cells in the array have resistances that fall in the region 620. This region is also known as the "margin area." The margin area is typically a bandwidth of resistances centered around reference point 631, wherein a sense amplifier will not be able to accurately distinguish a resistance within the margin area as either Rhigh or Rlow. In other words, typically, bit-cells with resistances that fall within margin area 620 (either directly in the region overlapping the R-low 622 and R-high curves 624 or in close proximity to the overlap region) will likely not be read accurately by a sense amplifier at high speeds Once the margin area is determined, at step 1012, the method comprises forcing the bit-cell resistances of memory bit-cells associated with the margin area to short circuits in order to widen a window between the distribution of acceptable high resistance bits and acceptable low resistance bits. Note that steps 1011 to 1012 can occur during product testing or characterization.

Finally, at step 1013, the method comprises replacing each of the short-circuited memory bit-cells with a corresponding redundant bit in the codeword associated with the short-circuited memory bit-cell. For example, during memory operation, the replacing can occur in accordance with a mapping scheme. In other words, for example, a redundant bit is mapped to the short-circuited bit in the codeword in accordance with the position of the short-circuited memory bit-cell. During memory operation then, a redundant bit is stored in the associated codeword in lieu of the short-circuited bit in accordance with the mapping. As discussed above, a mapping scheme will dictate the manner in which the redundant bits get mapped to the short-circuited bit-cells.

Figure 11:
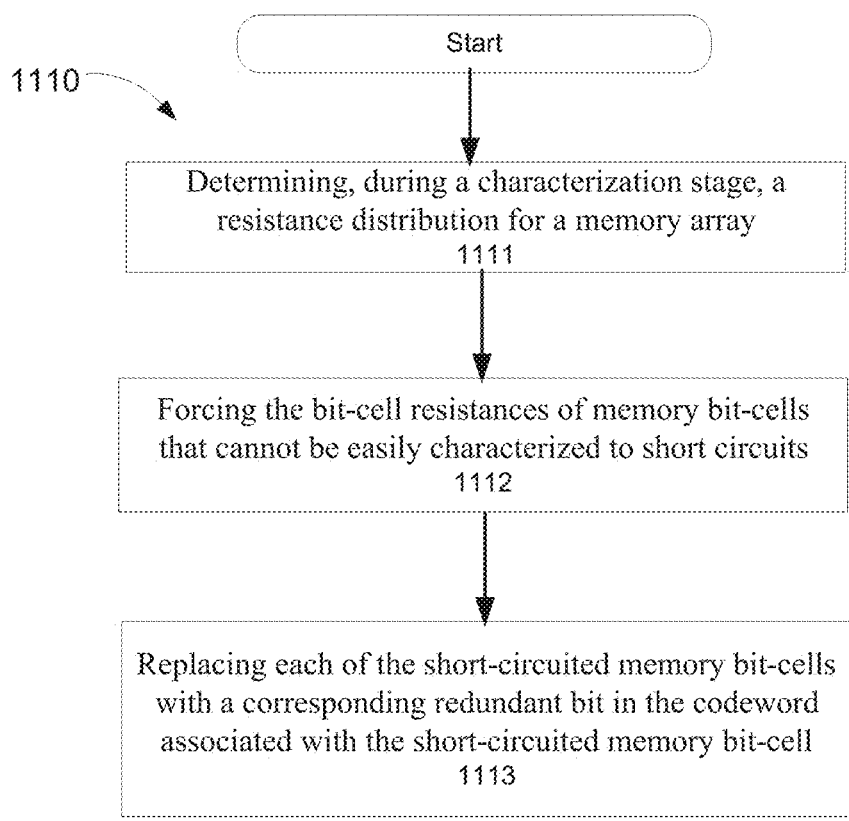
FIG. 11 shows a flowchart 1110 of another exemplary method for correcting bit defects in a STT-MRAM memory array in accordance with embodiments of the present invention.

FIG. 11 shows a flowchart 1110 of another exemplary method for correcting bit defects in a STT-MRAM memory array in accordance with embodiments of the present invention.

At step 1111, the resistance distribution of a memory array, e.g., STT-MRAM is characterized. In other words, a read operation is performed on the memory array to characterize the resistance distribution.

At step 1112, all bit-cells in the memory array that cannot be easily characterized are short-circuited. As noted above, such defects, which are neither shorts nor open circuits, are not user read or verify operations. Examples of such defects include stuck bits, waterfalls, shunts and low tunnel magnetoresistance (TMR) bits. Note that steps 1111 to 1112 can occur during product testing or characterization.

At step 1113, the method comprises replacing each of the short-circuited memory bit-cells with a corresponding redundant bit in the codeword associated with the short-circuited memory bit-cell. For example, during memory operation, the replacing can occur in accordance with a mapping scheme. In other words, for example, a redundant bit is mapped to the short-circuited bit in the codeword in accordance with the position of the short-circuited memory bit-cell. During memory operation then, a redundant bit is stored in the associated codeword in lieu of the short-circuited bit in accordance with the mapping. As discussed above, a mapping scheme will dictate the manner in which the redundant bits get mapped to the short-circuited bit-cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

We claim:

1. A method for correcting bit defects in an STT-MRAM memory, the method comprising:
   reading a codeword in the STT-MRAM memory, wherein the STT-MRAM memory comprises a plurality of codewords, wherein each codeword comprises a plurality of bits and a plurality of redundant bits;
   mapping defective bits in the plurality of bits of the codeword to redundant bits of the plurality of redundant bits based on a mapping scheme, wherein the mapping scheme is operable to determine a manner in which the defective bits in the codeword are to be mapped to the redundant bits, wherein the mapping comprises:
      determining if each bit from the defective bits represents an open circuit or a short circuit in the STT-MRAM memory;
      determining a respective position of each defective bit in the codeword; and
      mapping a respective redundant bit of the plurality of redundant bits to each
      defective bit in accordance with a position of each defective bit;
   based on the mapping, using mapped redundant bits in lieu of the defective bits in the codeword; and
   performing an ECC correction operation on the codeword read from the STT-MRAM memory to correct any additional errors in the codeword.

2. The method of claim 1, wherein the reading the codeword and the mapping of the defective bits are performed substantially simultaneously.

3. The method of claim 1, wherein the mapping scheme comprises a left to right mapping scheme, wherein a left most defective bit in the codeword is mapped to a left most redundant bit of the plurality of redundant bits of the codeword, and wherein each subsequent defective bit traversing from left to right is mapped to a next available redundant bit traversing from left to right.

4. The method of claim 1, wherein the mapping scheme comprises a right to left mapping scheme, wherein a right most defective bit in the codeword is mapped to a right most redundant bit of the plurality of redundant bits of the codeword, and wherein each subsequent defective bit traversing from right to left is mapped to a next available redundant bit traversing from a right to left.

5. The method of claim 1, wherein the mapping scheme alternates between a left to right mapping scheme and a right to left mapping scheme.

6. The method of claim 1, where the mapping scheme comprises:
   dividing the codeword into a plurality of segments; and
   allocating one or more redundant bits from said plurality of redundant bits to each of the plurality of segments, wherein a defective bit in each segment is mapped to a redundant bit that is allocated thereto.

7. The method of claim 1 further comprising:
   shorting ambiguous bits in the STT-MRAM memory, wherein the ambiguous bits have ambiguous resistances between being high or low bits; and
   using the mapping scheme to map the ambiguous bits to redundant bits.

8. A method for correcting bit defects in an STT-MRAM memory, the method comprising:
   reading a codeword in the STT-MRAM memory, wherein the STT-MRAM memory comprises a plurality of codewords, wherein each codeword comprises a respective plurality of bits and a respective plurality of redundant bits;
   mapping each defective bit in the codeword to a respective redundant bit of the plurality of redundant bits in accordance with a mapping scheme, wherein the mapping scheme is operable to determine a manner in which the defective bits of the codeword are to be mapped to redundant bits of the codeword, wherein the mapping comprises:
    determining if each defective bit represents an open circuit or a short circuit in the STT-MRAM memory;
    determining a position of the defective bit in the codeword; and
    mapping a redundant bit to the defective bit based on the position;
replacing the defective bits of the codeword with redundant bits of the plurality of redundant bits, wherein the defective bits are replaced with the redundant bits based on relative positions of the defective bits in accordance with the mapping scheme; and
performing an ECC correction operation on the codeword read from the STT-MRAM memory to correct any additional errors in the codeword.

9. The method of claim 8, wherein the reading the codeword and the mapping of the defective bits are performed substantially simultaneously.

10. The method of claim 8, wherein the mapping scheme comprises a left to right mapping scheme, wherein a left most defective bit in the codeword is mapped to a left most redundant bit of the plurality of redundant bits, and wherein each subsequent defective bit traversing from left to right is mapped to a next available redundant bit traversing left to right.

11. The method of claim 8, wherein the mapping scheme comprises a right to left mapping scheme, wherein a right most defective bit in the codeword is mapped to a right most redundant bit of the plurality of redundant bits, and wherein each subsequent defective bit traversing from right to left is mapped to a next available redundant bit traversing right to left.

12. The method of claim 8, wherein the mapping scheme alternates between a left to right mapping scheme and a right to left mapping scheme.

13. The method of claim 8, where the mapping scheme comprises:
    dividing the codeword into a plurality of segments; and
    allocating one or more redundant bits from said plurality of redundant bits to each of the plurality of segments, wherein a defective bit in each segment is mapped to a redundant bit that is allocated thereto.

14. An apparatus for correcting bit defects in an STT-MRAM memory, the apparatus comprising:
    a processor;
    an STT-MRAM memory comprising a plurality of codewords, wherein each codeword comprises a respective plurality of bits and a respective plurality of redundant bits, and wherein the processor is configured to:
        read a codeword in the STT-MRAM memory;
        map defective bits in the codeword to redundant bits of the plurality of redundant bits based on a mapping scheme, wherein the mapping scheme is operable to determine a manner in which the defective bits in the codeword are to be mapped to the redundant bits, wherein to map the defective bits, the processor is further configured to:
            determine if each defective bit represents an open circuit or a short circuit in the STT-MRAM memory;
            determine a position of the defective bit in the codeword; and
            map a redundant bit to the defective bit based on the position;
        replace the defective bits in the codeword with corresponding redundant bits as mapped and
        perform an ECC correction operation on the codeword read from the STT-MRAM memory to correct any additional errors in the codeword.

15. The apparatus of claim 14, wherein the processor is configured to read the codeword and map the defective bits simultaneously.

16. The apparatus of claim 14, wherein the mapping scheme comprises a left to right mapping scheme, wherein a left most defective bit in the codeword is mapped to a left most redundant bit of the plurality of redundant bits, and wherein each subsequent defective bit traversing from a left to right is mapped to a next available redundant bit traversing left to right.

17. The apparatus of claim 14, wherein the mapping scheme comprises a right to left mapping scheme, wherein a right most defective bit in the codeword is mapped to a right most redundant bit of the plurality of redundant bits, and wherein each subsequent defective bit traversing from right to left is mapped to a next available redundant bit traversing right to left.

18. The apparatus of claim 14, wherein the mapping scheme alternates between a left to right mapping scheme and a right to left mapping scheme.

19. The apparatus of claim 14, wherein in order to implement the mapping scheme, the processor is configured to:
    divide the codeword into a plurality of segments; and
    allocate one or more redundant bits from said plurality of redundant bits to each of the plurality of segments, wherein a defective bit in each segment is mapped to a redundant bit that is allocated thereto.

* * * * *